United States Patent [19]

Tamura et al.

[11] Patent Number: 4,468,075
[45] Date of Patent: Aug. 28, 1984

[54] STRUCTURE OF ELECTRICAL CONNECTING DEVICE

[75] Inventors: Masayoshi Tamura; Ryohei Kinoshita, both of Suzaka; Norio Matsubayashi, Nagano; Mitsuharu Matsumoto, Kawasaki; Toshiaki Sukeda; Osamu Hirakawa, both of Suzaka, all of Japan

[73] Assignee: Fujitsu Limited, Kawasaki, Japan

[21] Appl. No.: 286,864

[22] Filed: Jul. 27, 1981

[30] Foreign Application Priority Data

Jul. 28, 1980 [JP] Japan .................................. 55-103456

[51] Int. Cl.³ .................. H01R 13/629; H01R 13/639
[52] U.S. Cl. ................................ 339/75 M; 339/91 R
[58] Field of Search ............. 339/75 R, 75 M, 74 MP, 339/88 R, 40, 42, 65; 365/1, 2

[56] References Cited

U.S. PATENT DOCUMENTS

| | | | |
|---|---|---|---|
| 3,789,345 | 1/1974 | Reimer et al. | 339/75 MP |
| 4,027,295 | 5/1977 | Maegawa et al. | 365/2 |
| 4,084,874 | 4/1978 | Georgopolous | 339/75 MP |
| 4,176,897 | 12/1979 | Cameron | 339/40 |
| 4,310,897 | 1/1982 | Lazzari | 365/1 |

Primary Examiner—Eugene F. Desmond
Attorney, Agent, or Firm—Staas & Halsey

[57] ABSTRACT

An electrical connecting device where electrical terminals are connected between two connector units by inserting the first connector unit into an insertion mouth of the second connector unit. Moreover, the electrical terminals of both units come into pressure contact by inserting the first connector unit into the second connector unit and then rotating the first connector unit in the direction almost at a right angle to the inserting direction. Such a structure is highly adaptable to an electrical connecting device where the first connector unit comprises a magnetic bubble memory unit, while the second connector unit comprises a holder unit for accommodating the bubble memory unit. This device realizes a stable and reliable electrical connection between both units with an excellent operability for insertion.

10 Claims, 29 Drawing Figures

STRUCTURE OF ELECTRICAL CONNECTING DEVICE

BACKGROUND OF THE INVENTION

This invention relates to an electrical connecting device having at least two connector units, electrical terminals of both connector units being connected by inserting the first connector unit into the second connector unit.

This invention will bring about various advantages where the electrical connecting device has the first connector unit comprising a cassette type magnetic bubble memory unit accommodating a magnetic bubble memory element, while the second connector unit comprises a holder unit which allows insertion thereto of said bubble memory unit and connects it to a main apparatus.

Electrical connection between two connector units of a electrical connecting device is generally realized through a close slide contact between electrical terminals of the two units, one unit providing an electrical plug terminal, while the other unit provides an electrical jack terminal. However, one cannot be assured that such a slide contact type connector will have a long reliable use life because the contact metallic layer formed by plating on the electrical terminal surface may become damaged or worn, easily causing poor contact. Moreover, the case where many electrical terminals are provided, large insertion and withdrawal forces are required, resulting in difficulty in obtaining a desired electrical connection.

An alternative to the above is a static pressure contact type structure having a zero force insertion and withdrawal step where no wearing of the contact metallic layer is generated. In this method, no contact between the electrical jack and plug occurs at the time of insertion. However, after they are mutually inserted, they come into contact with each other by a process that one electrical terminal is moved into contact with the other electrical terminal. Various kinds of contact pressure type structures have been proposed and in use but have been inferior in the operability because the inserting operation of the plug connector unit and the operation for contacting the electrical terminals are performed individually. For example, the structure explained below is well known as the pressure contact type structure where the electrical jack terminals are maintained previously at the open condition by means of an ellipse-shaped material, and the electrical jack terminals are returned to the closed condition after the plug connector unit is inserted by rotating the ellipse-shaped material using the knob. By this action the electrical jack terminal stationarily comes into contact with the plug terminal without sliding motion.

This structure requires an operator to insert the plug connector unit into the jack connector unit with one hand and thereafter to rotate the knob with that one hand or the other hand, making troublesome the connecting operations.

An existing electrical connecting device consisting of the bubble memory unit and holder unit has the structure where the electrical terminals of both units come into contact with each other through sliding contact. The magnetic bubble memory requires many electrical terminals for writing, propagating and reading bubbles and therefore it has been difficult for the existing bubble memory unit to accommodate a plurality of magnetic bubble memories due to the large insertion and withdrawal forces.

Because in the case of a magnetic bubble memory the control of bubbles is performed with a minute current, the existing structure has a continuing disadvantage or problem in that mis-detection and mis-generation of bubbles easily occur due to the wearing condition of the contact metallic layer.

SUMMARY OF THE INVENTION

It is an object of the present invention to provide a device that has solved the above-mentioned existing disadvantages and assures stable and reliable electrical connection with an excellent operability in such an electrical connecting device where the first connector unit is inserted into the holding unit of the second connector unit and thereby the electrical terminals of these units are connected.

It is another object of the present invention to provide a device that assures excellent operability for electrical connection of a bubble memory unit and also attains stable and reliable electrical connection in such an electrical connecting device where the first connector unit comprises a cassette type magnetic bubble memory unit and the second connector unit comprises a holder unit for accommodating the bubble memory unit.

A first characteristic of an electrical connecting device of the present invention lies in the structure where after the first connector unit is inserted into the second connector unit, the first connector unit is rotated in a direction almost at a right angle to the inserting direction and thereby the electrical terminals of both units come into contact with pressure and the first connector unit is locked under this contact condition.

A second characteristic of an electrical connecting device of the present invention lies in the structure where the first connector unit comprises a cassette type magnetic bubble memory unit and the second connector unit comprises a holder unit for accommodating the bubble memory unit, and after the bubble memory unit is inserted into the holder unit, the bubble memory unit is rotated in a direction almost at a right angle to the inserting direction, thereby the electrical terminals of both units come into contact with pressure and the bubble memory unit is locked under this contact condition.

Moreover, an electrical connecting device having the above-described second characteristic desirably has a button for cancelling the lock of the second connector unit, the first and second connector units being unlocked by the operation of the button and thereby the contact condition between them is freed, and thus the first connector unit becomes free for insertion and withdrawal.

DETAILED DESCRIPTION OF THE PREFERRED EMBODIMENTS

While the present invention can be adapted to any electrical connecting device wherein an electrical connection between electrical terminals of both connector units is achieved by inserting the first connector unit into the second connector unit, a cassette type magnetic bubble memory system is shown as the preferred embodiment.

Figure 1:
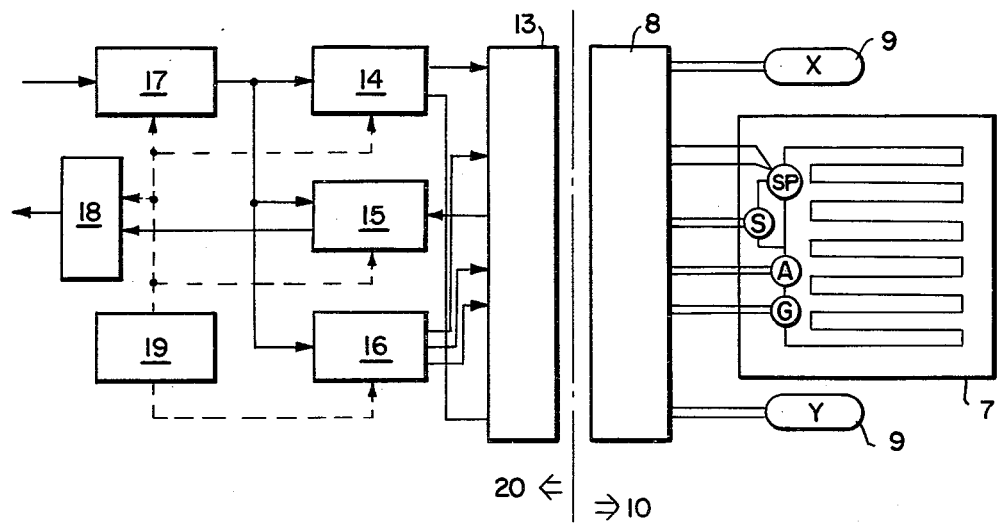
FIG. 1 is a circuit diagram illustrating an example of a cassette type magnetic bubble memory system incorporating the present invention.

FIG. 1 explains the circuit structure of the cassette type magnetic bubble memory system according to the present invention. In this figure, reference numeral 10 is a cassette type magnetic bubble memory unit and 20 is a holder unit which is a terminal for a main apparatus. In addition, 7 is a bubble chip comprising function blocks, such as magnetic bubble generator G, divider SP, detector S and eraser A. In this figure, the bubble chip 7 has a single loop structure but a major/minor loop structure also provides such function blocks. 8 is a connector providing electrical terminals, 9 is a rotating field generation coil consisting of an X coil and a Y coil provided in such a way as to cover the bubble chip 7. The magnetic bubble memory element comprises the bubble chip 7, coil 9 and a bias magnet packaged in the shield case. 13 is the connector providing electrical terminals for the corresponding connector 8 in the side of bubble memory unit 10, 14, is a coil driver circuit for generating a rotating field along the bubble chip surface by supplying a sine wave current or triangular wave current, 15 is a bubble read circuit, 16 is a magnetic bubble control circuit comprising a bubble writing circuit for generating bubbles by feeding a current to the bubble generator G, a circuit for dividing bubbles by feeding a current to the divider SP, a circuit for detecting existence of bubbles by feeding a current to the detector S and a circuit for erasing unwanted bubbles by feeding a current to the eraser A. 17 is a control circuit which controls the coil driver circuit 14, bubble read circuit 15 and bubble controller 16 in accordance with a command signal issued from a central processing unit (not shown).

In addition, 18 is a register and 19 is a current circuit. Such a structure allows the comparatively small capacity and portable bubble memory unit 10 to be connected as required to the holder unit 20 via the connectors 8, 13 and the bubble memory element in the unit 10 to be driven via the unit 20 according to the control signal issued from the main apparatus.

Figure 2:
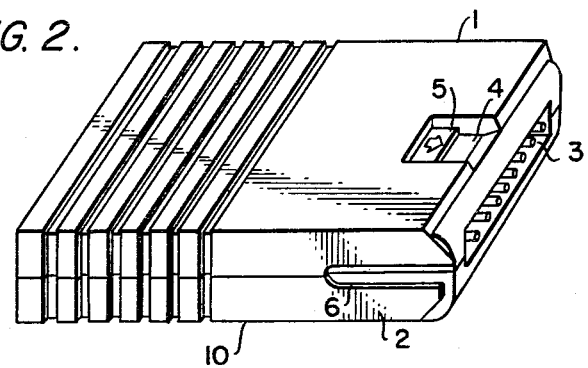
FIG. 2 is a perspective view of a cassette type magnetic bubble memory unit proposed in a commonly assigned U.S. application Ser. No. 192,804, filed Oct. 1, 1980, entitled "Magnetic Bubble Memory Device."

In the case of the bubble memory unit shown in FIG. 2, the magnetic bubble memory element (not illustrated)

is accommodated within upper and lower cases 1, 2 of a box type mold as shown in FIG. 2 and a plurality of slide contact type electrical terminals 3 forming the connector 8 (refer to FIG. 1) are provided at the inserting terminal portion.

The upper case 1 provides a dent 4 at the inserting terminal portion at the outer surface, and provided within the dent 4 is a freely-sliding slide plate 5 for setting the bubble information writing inhibiting state or writing allowing state.

The upper case 1 and lower case 2 are provided with a guide groove 6 on both sides in different widths for preventing mis-insertion of the memory unit 10 into the holder unit 20.

Figure 3:
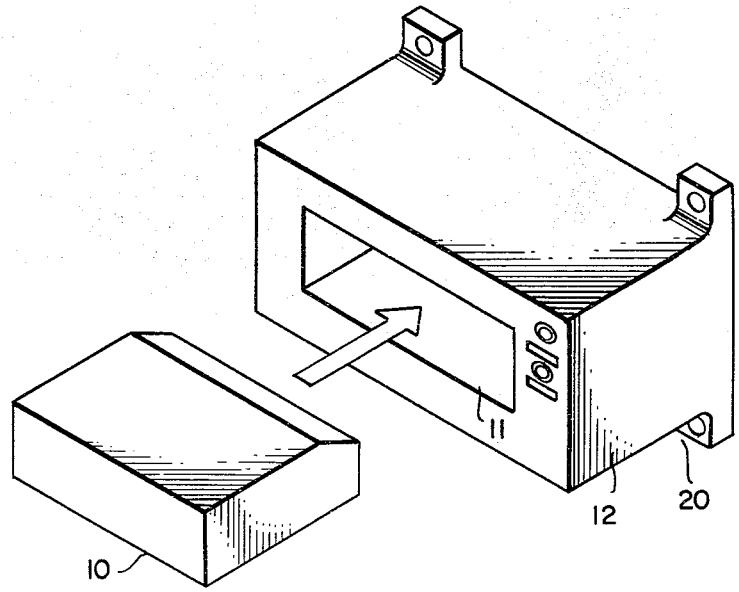
FIG. 3 is a perspective view illustrating an existing cassette type magnetic bubble memory unit and the holder unit before establishing the electrical connection between them.

As shown in FIG. 3, the existing holder unit 20 has a molded type holder case 12 providing a bubble memory unit inserting mouth 11 and can be used by mounting the holder case 12 to a panel surface of the main apparatus. At the rear side of the inserting mouth 11, the connector (not illustrated) providing electrical terminals of a spring type corresponding to the electrical terminals 3 of the memory unit and the printed circuit board for mounting the bubble control circuit are provided. Existingly, the outlined bubble memory unit 10 is inserted into the inserting mouth 11 and thereby the electrical connection has been obtained through the sliding contact of the electrical terminals of both units 10, 20.

However, this structure has a disadvantage in that a heavy force of insertion and withdrawal is required and the contact pressure during sliding contact causes the surface of the electrical terminals to be damaged, shortening the contact life. Since the bubble memory element is driven by a minute current, unstable contact causes erroneous writing or erasing of bubble information, a serious problem for such a cassette type magnetic bubble memory system.

Figure 4:
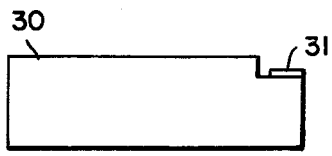
FIG. 4 is a side view illustrating the principle and structure of a cassette type magnetic bubble memory unit incorporating the present invention.

FIGS. 4 to 7 show the basic structure and operations incorporated into an embodiment of the present invention. FIG. 4 shows the structure of the bubble memory unit, FIG. 5 the structure of the holder unit, FIG. 6 the condition where the bubble memory unit is inserted into the holder unit, and FIG. 7 the condition where the bubble memory unit inserted is rotated and then electrically connected to the holder unit.

Figure 5:
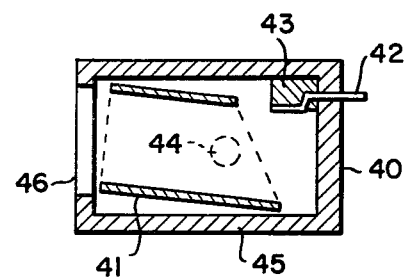
FIG. 5 is a side sectional view illustrating the principle and structure of a holder unit incorporating the present invention.

In FIG. 4, the cassette type bubble memory unit 30 comprising the bubble memory element is mounted with the contact surface of a plurality of electrical terminals 31 located at the rear upper surface of the inserting end of the unit and being exposed while the electrical terminals 31 are connected as required to the bubble memory element (not illustrated) in the unit 30. On the other hand, as shown in FIG. 5, the holder unit 40 has a rotatable unit accommodation case 41 and a connector 43 for mounting a plurality of fixed electrical terminals 42. The case 41 is supported within a holder case 45 by a boss 44 provided at both the right and left side walls with freedom of rotation.

Moreover, one end of the electrical terminals 42 is guided out of the connector 43 and projected out of back of case 45 while the contact surface of the other end is exposed and faces downward at the rear side within case 45. The case 45 also provides an insertion mouth 46. The connecting operation between both units 30, 40 is performed as follows.

Figure 6:
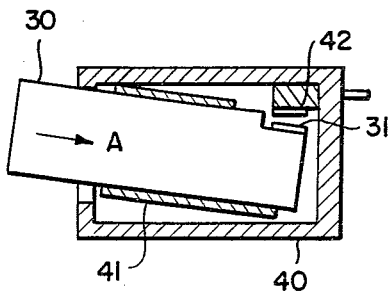
FIG. 6 is a side sectional view illustrating the principle and the condition of the bubble memory unit shown in FIG. 4 inserted into the holder unit shown in FIG. 5 in accordance with the present invention.

First, as shown in FIG. 6, the unit 30 is inserted into the case 41 from the insertion mouth 46 as shown by the arrow A. At this time, the case 41 is held in an inclined condition, with the rear portion in a downward position. Therefore, in this insertion condition, the plurality of electrical terminals 31 are opposing the fixed electrical terminals 42 but with the corresponding contact surfaces being apart.

Figure 7:
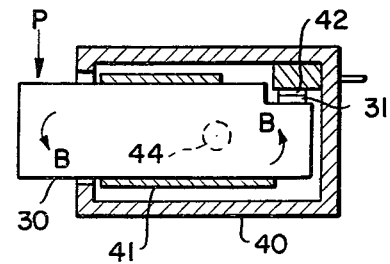
FIG. 7 is a side sectional view illustrating the principle and the condition of the electrical connection being established between the bubble memory unit and holder unit in accordance with the present invention.

When a pressure P, as indicated in FIG. 7, is applied to the upper surface of front side of the unit 30, the unit 30 rotates in the direction indicated by the arrow B together with the case 41 and the corresponding contact surfaces of the electrical terminals 31 and fixed electrical terminals 42, of which at least one is composed of elastic structure, come into pressure contact, making it possible to send and receive electrical signals to and from the bubble memory element in the unit 30.

The unit 30 is mounted in such a manner that the contact surfaces of the electrical terminals 31 are exposed at the upper surface of the rear side, but the terminals 31 may be mounted to the lower surface of the front side.

However, in this case, the fixed electrical terminals must be provided within the unit 40 opposing electrical terminals located at the lower surface of front side of the unit 30 and the rotating axis of the case 41 must be set at the rear side rather than as shown in the embodiment of FIG. 5.

Figure 8:
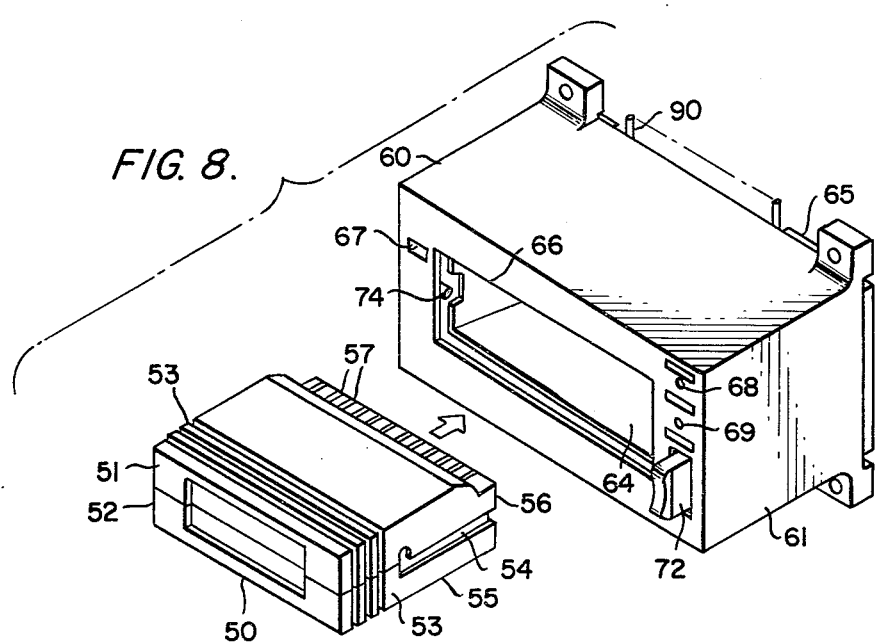
FIG. 8 is a perspective view of the bubble memory unit and holder unit incorporating the present invention before they are electrically connected.
Figure 9:
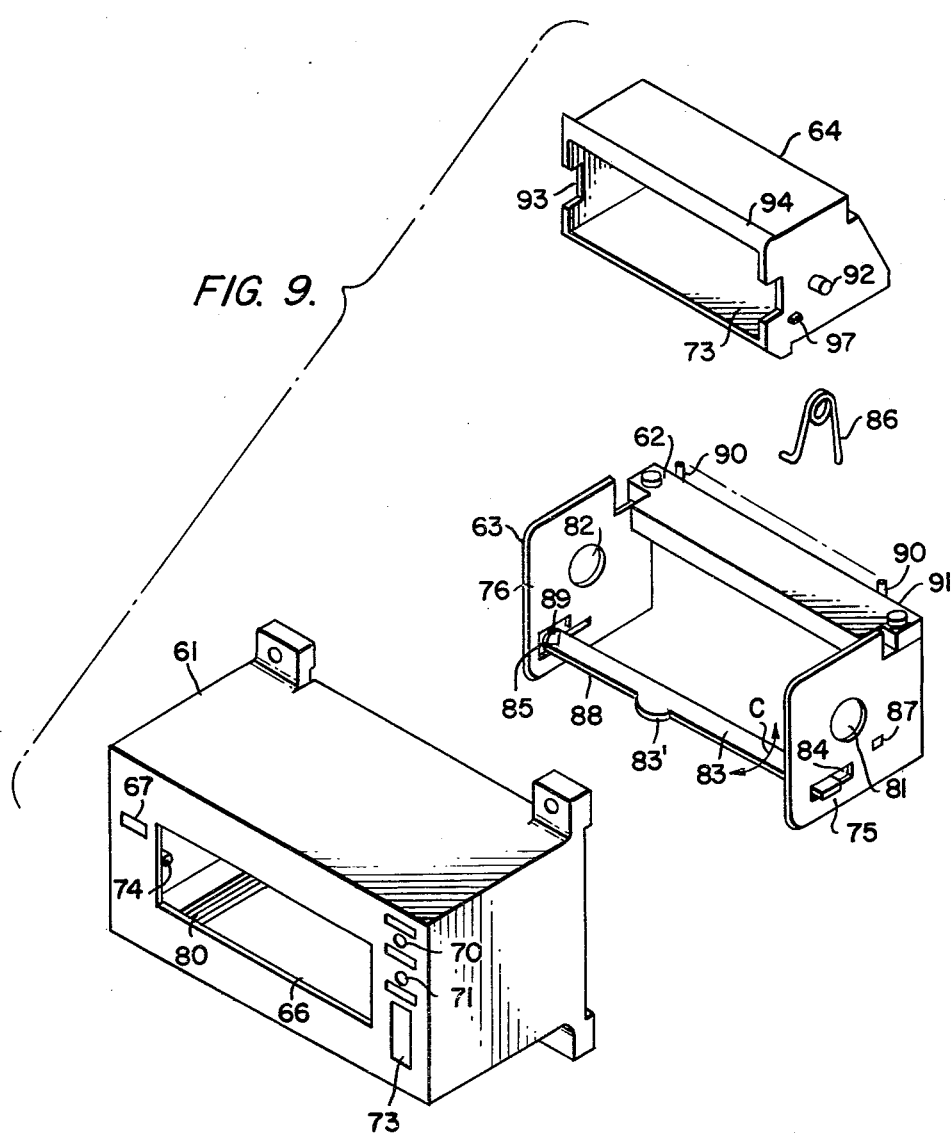
FIG. 9 is a perspective view illustrating a disassembled holder unit incorporating the present invention.
Figure 10:
FIG. 10 is a side view illustrating a coil spring for lock level recovery incorporated into the present invention.

FIG. 8 is an embodiment of the basic structure of the units shown in FIGS. 4 and 7. Namely, a bubble memory unit 50 comprising the bubble memory element has upper and lower cases 51, 52 consisting of a molded insulating resin material. At the upper surface of the rear portion of the inserting end of the upper case 51, the electrical terminals 57 are mounted with the contact surfaces exposed. In addition, at both right and left side surfaces 53 of the aggregated cases 51 and 52, an L-shaped groove 54 is formed. This groove 54 is almost linearly parallel to lower surface 55 of the lower case 52. One end of the groove is open at the rear surface 56 of the unit 50, while the other end is bent upward at the center portion of the side 53. Holder unit 60 comprises with further reference to the perspective view of the unit in a disassembled condition in FIG. 9, a holder case 61 consisting of a molded insulating resin material, holder bracket 63 comprising the connector, unit accommodation case 64 consisting of a molded insulating resin material and a rear plate 65.

Figure 14:
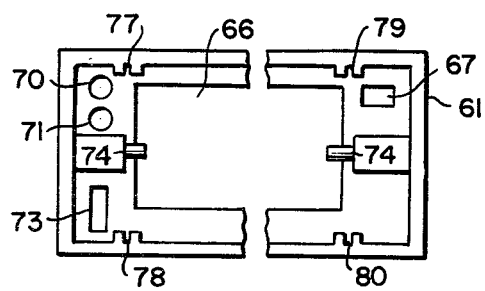
FIG. 14 is a rear front view of a holder case of a holder unit incorporated into the present invention.

Also by referring to FIG. 14, the box type holder case 61 comprises inserting mouth 66 of the unit 50, through window 67, through holes 70, 71 for mounting light emitting diodes 68, 69 which indicate the unit inserting condition and rotating operation completing condition, and through hole 73 for mounting a push button 72 which releases the lock condition of the inserted unit 50. The case 61 provides a pair of round projections 74 which are projecting inwardly from the right and left opposing sides within the inserting mouth 66 and also aggregatingly provides two pairs of grooves 77 to 80 which guide and support side plates 75, 76 of bracket 63 and are arranged face to face vertically.

The holder bracket 63 has a U-shaped structure where the side plates 75, 76 comprising a pair of metal plates are combined with a connector 62.

Figure 11:
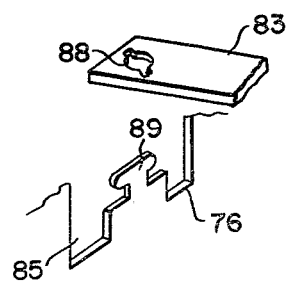
FIG. 11 is a divided perspective view illustrating the mounting portion of lock level incorporated into the present invention.
Figure 12:
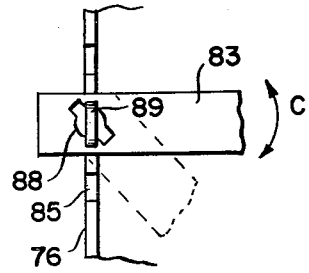
FIG. 12 is a plan view for explaining the operation of lock level incorporated into the present invention.

The side plates 75, 76 respectively have through holes 81, 82 for supporting the case 64 with freedom of rotation and through holes 84, 85 for mounting a lock lever 83. In addition, the one side plate 75 provides an inner projection 87 for supporting one end of a coil spring 86. Both ends of the lock lever 83 are located respectively in the through holes 84, 85. Thus the lock lever 83 is mounted in such a way that one end freely rotates in the side of through hole 85, while the other end can freely slide in the through hole 84. As a result, the lock lever 83 is mounted in such a manner that it can freely sway in the direction indicated by the arrow C with the center 83' between the ends being used for applying backward pressure. In addition, the lock lever 83 is always pressed forward because of the coil force of a coil spring 86' inserted into a T-shaped projection 89 of plate 76 (refer to FIG. 11) and having ends engaged with the lock lever 83 and the side plate 76. Moreover, free rotation of the one end of the lock lever 83 is realized by the structure wherein the T-shaped projection 89 formed in the through hole 85 is inserted, as best shown in FIGS. 11 and 12, into a through hole 88 of the lever 83 having grooves provided at the ends. The connector 62 is provided with a plurality of fixed electrical terminals 90 for correspondence with the electrical terminals 57 of unit 50. The one end of the electrical terminal 90 is exposed at the lower side of the connector mold 91, while the other bent end is projected upward.

Figure 13:
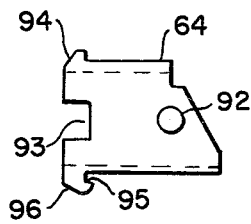
FIG. 13 is a side view of a unit accommodation case incorporated into the present invention.

As shown in FIG. 13, the unit accommodation case 64 has a boss 92 at an area a little to the rear of the center of the right and left side walls, and a groove 93 which misses the projection 74 upon insertion of the case 64 into case 61 provided at the front side of both side walls. The case 64 also has a projection 94 at the upper part of the front side and a projection 96 which provides for an engaging groove 95 opening to the back at the lower part of the front side. In addition, a projection 97 (FIG. 9) to which the one end of coil spring 86 is engaged is provided at one (right) side wall.

Figure 15A:
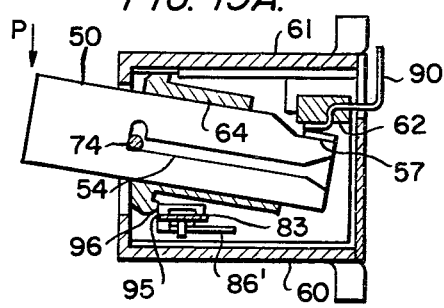
FIG. 15A is a side sectional view illustrating the condition where the bubble memory unit is inserted into the holder unit according to the present invention.
Figure 15B:
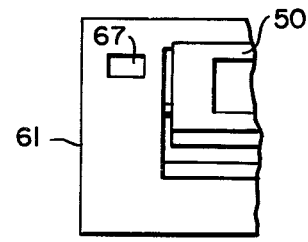
FIG. 15B is a front view illustrating the condition where the bubble memory unit shown in FIG. 8 is inserted into the holder unit in accordance with the present invention.

The electrical connection between the bubble memory unit 50 and holder unit 60 will now be explained. When the unit 50 is inserted into the inclined case 64, as shown in FIGS. 15A and 15B, the unit 50 is inserted into the inside of case 61 from the inserting mouth 66 and guided through engagement between the groove 54 and projection 74.

The projection 74 eventually hits the bending part of the groove 54 and stops, completing the inserting operation of the unit 50. In this case, the electrical terminals 57 of the unit 50 and the terminals 90 of unit 60 are respectively opposing each other vertically.

When a pressure P is applied on the forward end portion of the unit 50 projecting from the unit 60, the unit 50 and the case 64 rotate around the rotating axis of the boss 92, resulting in pressure contact between the electrical terminals 57 and 90. At this time, the projection 96 of the case 64 comes into contact with the forward proejction 83' of the lever 83 (refer to FIG. 9) and the lever 83 is pushed backward along the curved surface of the projection 96.

Thereafter, it returns by the spring force of coil spring 86' and drops into the engaging groove 95 of the case 64. Simultaneously, the projection 74 engages with the upward bending portion of groove 54 and thereby the unit 50 is completely inserted.

Figure 16A:
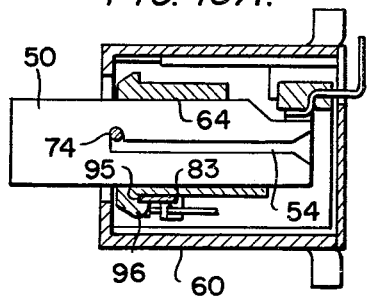
FIG. 16A is a side sectional view illustrating the condition where the bubble memory unit and holder unit shown in FIG. 15A, B are electrically connected according to the present invention.
Figure 16B:
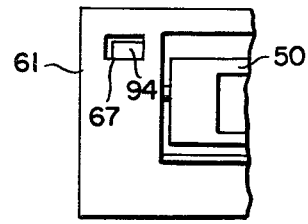
FIG. 16B is a front view of the units in accordance with the present invention under the condition of FIG. 16A.

The inserted condition is shown in FIGS. 16A and 16B. The unit 50 and unit 60 are locked to each other through engagement between the bending portion of groove 54 and projection 74, and engagement between the groove 95 of case 64 and projection 83' of lever 83. In such a condition, the unit 50 projects horizontally and is prevented to return to the position of initial insertion as shown in FIG. 15A.

Moreover, the projection 94 of case 64 which is provided at the upper part higher than the window 67 of the case 61 and thus hidden in the initial insertion condition of FIG. 15B is now in direct sight through the window 67 in the inserted condition of FIG. 16B. Thereby, insertion of the unit 50 can be confirmed by visual inspection. Preferably the surface of projection 94 is painted with a bright color paint or is engraved with the letters such as SET, etc., so that insertion of the unit 50 can be confirmed more readily by visual inspection.

The contact pressure of the electrical terminal 57 and fixed electrical terminal 90 is generally selected to be about 100 g in order to obtain a reliable contact characteristic. For example, therefore, in case the electrical terminals 57 and fixed electrical terminals 90 comprise 28 terminals, the total contact pressure reaches about 3 kg. The present invention utilizes this preselected contact pressure principle. For example, when the distance between the boss 92 and terminals 57 of the (unit 50) case 64 is considered as l, while the distance between the boss 92 to the point where a pressure P is applied is considered as 3l, the applied pressure P becomes about 1 kg, significantly reduced from the total terminal contact pressure.

The inserted unit 50 can be removed from the unit 60 by the following operation. Namely, when the push button 72 is pushed by the operator, the end point of the push button 72 moves backward against that portion of the lever 83 projecting outside of the side plate 75. As a result, engagement between the lever 83 and case 64 is released and simultaneously the case 64 returns to the inclined condition shown in FIG. 15A due to the spring force of the coil spring 86. Therefore, the unit 50 can be pulled out of the unit 60 in this released condition.

As explained above, the first embodiment of the present invention attains stable contact of the electrical terminals and outstandingly expands the operating life, in addition to requiring less pressure P force than the required contact pressure between the corresponding electrical terminals. Moreover, this embodiment brings about excellent practical use, namely the unit can be inserted only with a single hand, electrical connection can be established only by rotating the knob and total operation is fully simplified. The lock mechanism for the unit to be inserted has advantages in that it is stable for contact pressure of the electrical terminals and is simple in structure. Moreover, the embodiment also provides an advantages in that the inserting condition of the unit inserted can be easily confirmed visually through the small window provided at the front side of the receiving unit. In summary, the electrical connecting device of the present invention offers many practical advantages, such as a highly reliable electrical connection being obtained, unit insertion/withdrawal and connection/disconnection of the electrical connection being realized with a single step operation and, moreover, a simple structure for assuring economical production.

Figure 17:
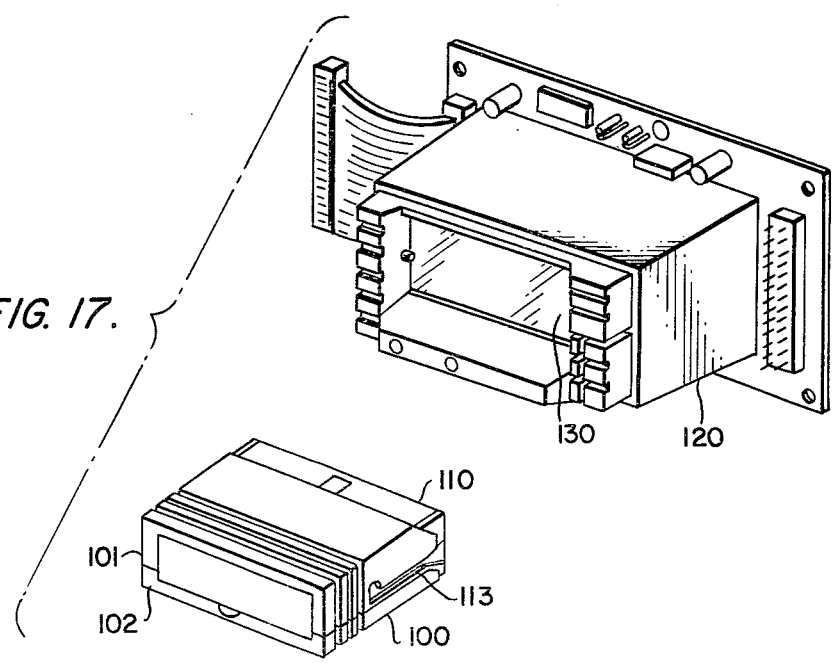
FIG. 17 shows another embodiment of the present invention, and, more particularly, a perspective view of the bubble memory unit and holder unit before they are electrically connected.
Figure 18:
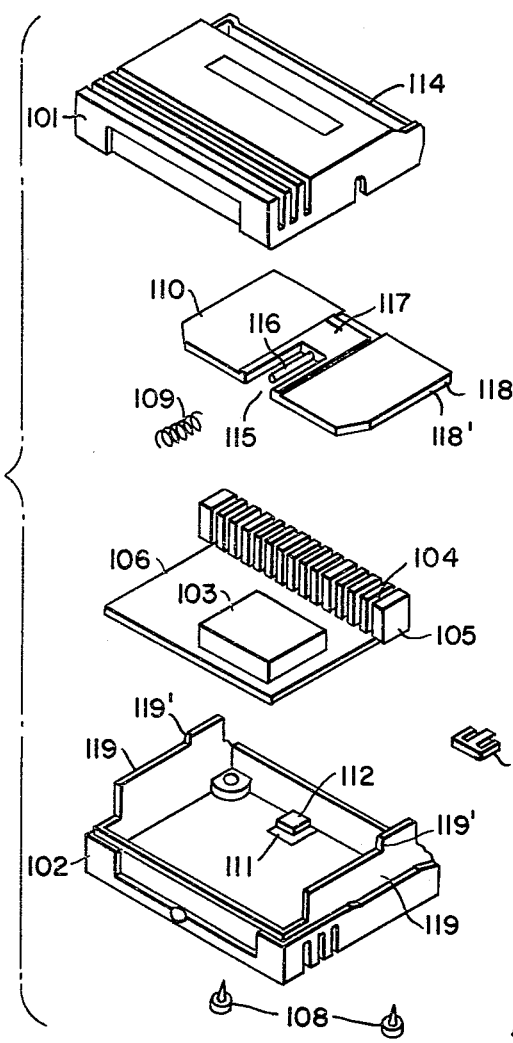
FIG. 18 is a perspective view of the bubble memory unit shown in FIG. 17 in a disassembled condition.

The second embodiment of the present invention will now be explained by referring to FIG. 17 to FIG. 24. In FIG. 17, a bubble memory unit 100 is particularly different from the unit 50 of the first embodiment in that a cover 110 which can be freely removed or attached for protection of the electrical terminals is provided. In the same way, a holder unit 120 is particularly different from the unit 60 in that a cover 130 which can freely cover the insertion mouth is provided.

First, the structure of unit 100 will be explained by referring to FIGS. 18 to 22.

The unit 100 comprises the following basic components: upper and lower cases 101, 102 consisting of a molded insulating resin material, a printed circuit board 106 for mounting a magnetic bubble memory element 103, a connector 105 providing electrical terminals 104, an E-shaped slide plate 107 consisting of an insulating resin material for setting the bubble information writing inhibiting state or writing allowing state, a screw 108 for connecting the cases 101, 102, a coil spring 109 and a plate cover 110 consisting of a molded insulating resin material. The slide plate 107 is positioned between the dent 111 and projection 112 of the lower case 102 and accommodates thereon the PC board 106 and the cover 110, and the upper case 101 is fixed thereto with the screws 108. In this structure, an L-shaped groove 113 is formed at the side of the unit 100 (FIG. 17) as in the case of the first embodiment. The connector 105 is located at a window 114 formed at the upper part of the rear side of the insertion end of the upper case 101, and the electrical terminals 104 of the connector 105 can be seen from the outside at the time of opening the cover 110. Moreover, the cover 110 has a cut-away part 115 at the center, a pin 116, and a coil spring 109 entered around the pin 116 in the cut-away part 115.

Moreover, at the center of the upper surface of the cover 110, a projection 117 is formed while at the rear part of the lower surface, a level-difference surface 118 is formed. The cover 110 is supported with freedom of sliding between the upper surface of right and left side plates 119 of the lower case 102 and the internal surface of the upper case 101, and usually portion 118' of the level-difference surface 118 and portion 119' of the side plate 119 come into contact with each other by means of the spring force of the coil spring 109. In this condition, the window 114 is closed by the rear portion of cover 118 and thereby the connector 105 cannot be seen from the outside.

Figure 19A:
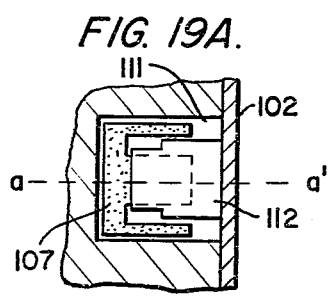
FIG. 19A shows the structure of the slide plate shown in FIG. 18 for setting a bubble information writing inhibiting state or writing allowing state, and, more particularly, shows a plan view of the plate incorporated into the present invention indicating the writing inhibiting state.
Figure 20A:
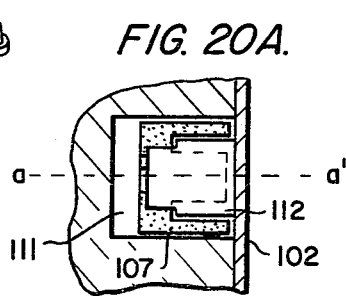
FIG. 20A is a plan view of the slide plate incorporated into the present invention indicating the bubble information writing allowing state.
Figure 19B:
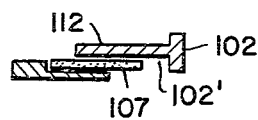
FIG. 19B is a sectional view of the slide plate incorporated into the present invention taken along line a . . . a' of FIG. 19A.
Figure 20B:
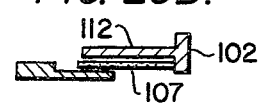
FIG. 20B is a sectional view of the slide plate incorporated into the present invention along line a . . . a' of FIG. 20A.

FIGS. 19 and 20 show the operating condition of slide plate 107. In FIGS. 19A and B, the slide plate 107 is opening and resultingly a dent 102' is formed at the bottom of the lower case 102. For this reason, the bubble information writing inhibiting state signal can be obtained by detecting this dent 102' with a switch (not illustrated) provided within the unit 120. In FIGS. 20A and B, the slide plate 107 is closing and thereby the bubble information writing allowing state signal can be obtained.

Figure 21:
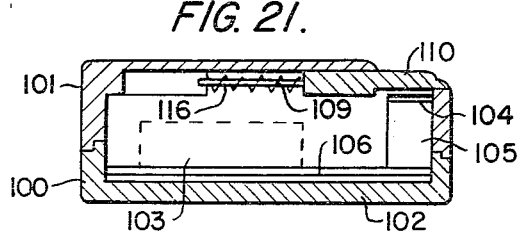
FIG. 21 is a side sectional view illustrating the closing condition of the electrical terminal protection cover of the bubble memory unit in FIG. 17 in accordance with the present invention.
Figure 22:
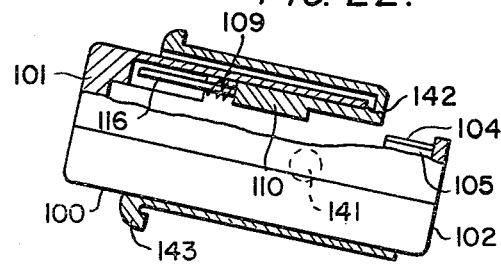
FIG. 22 is a side sectional view illustrating the open condition of the protection cover of the bubble memory unit in FIG. 17 in accordance with the present invention.

FIGS. 21 and 22 illustrate respectively the opening and closing operation of the cover 110. Namely, the unit 100 shown in FIG. 21 is still not inserted and in this condition, the cover 110 is closed by the spring force of coil spring 109 and the electrical terminals 104 cannot be seen from the outside. When the unit 100 in this condition is inserted into the unit accommodation case 140 (refer to FIG. 23) of the holder unit 120 explained later, as shown in FIG. 22, the projection 117 of the cover 110 is engaged with the projection 142 (refer to FIG. 23) provided at the inside of the rear portion of the case 140 and resultingly the cover 110 is automatically opened at the time of the unit 100 insertion. Therefore, in this inserted condition, the electrical terminals 104 are exposed in the window 114 and the same operation as that shown in FIG. 16 establishes the electrical connection with the electrical terminals of the holder unit side. When the unit is withdrawn, the cover 110 is automatically returned to its closed position by means of the bias force of coil spring 109.

Figure 23:
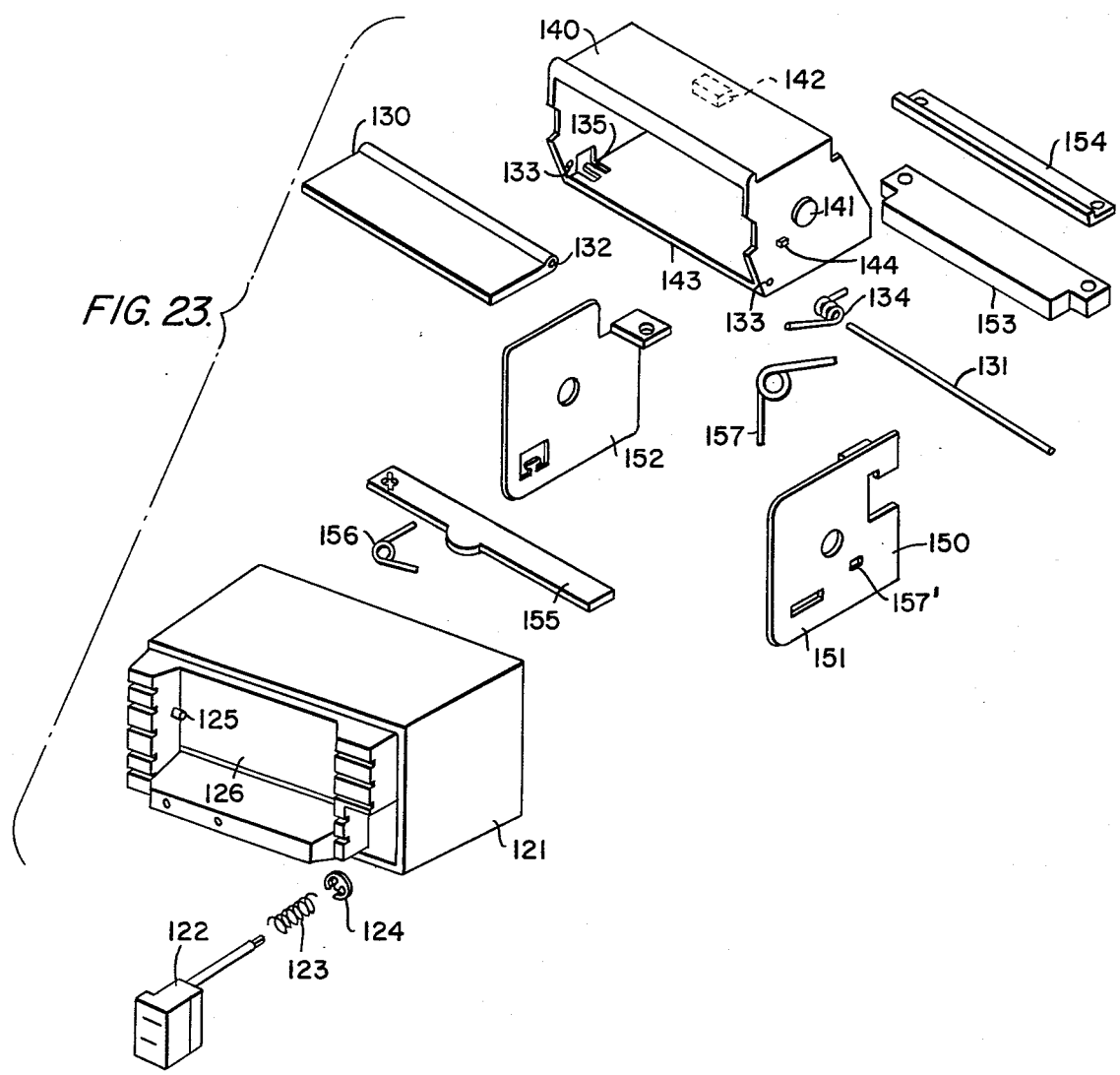
FIG. 23 is a perspective view of the holder unit of FIG. 17 in a disassembled condition.

Now, the structure of holder unit 120 in the second embodiment will be explained by referring to FIG. 17 and FIG. 23.

The unit 120 is almost the same as the unit 60 of the first embodiment from a structural standpoint. Namely, holder case 121 of the unit 120 at least provides a push button 122 for operating the lock lever, coil spring 123 for push button recovery, ring 124 for preventing removal of the push button, projection 125 for guiding the unit 100 into the unit inserting mouth 126. The unit accommodation case 140 at least provides boss 141, projection 142 for opening the cover 110 formed at the inner side of the case upper wall, a projection 143 formed at the lower portion of front side which is engaged with the lock lever 155 and an outer projection 144 on the right side wall for engagement with a coil spring 157. The holder bracket 150 supporting the case 140 with freedom of rotation at least provides a pair of right and left side plates 151, 152, respectively, connector 153 for connecting the side plates 151 and 152 and comprising electrical terminals, connector clamping plate 154, lock lever 155 which sways about one end, coil spring 156 for lock lever recovery, and coil spring 157 and coil spring engaging inner projection 157' for unit accommodation case recovery. The cover 130 which is a characteristic of this unit 120 is composed of a molded insulating resin material and has at one end thereof a through hole 132 through which a rotating axis shaft 131 passes. To mount the cover 130, the case 140 has through holes 133 in the right and left side walls where the rotating axis shaft 131 passes therethrough and a projection 135 for mounting the twisted coil spring 134 for pushing forward the cover 130. The cover 130 can be mounted to the case 140 by, at first, inserting the coil portion of coil spring 134 into the projection 135 and then engaging one end within the side wall. Then, the cover 130 is mounted to the case 140 in such a way that the rotating axis shaft 131 passes through the holes 132 and 133. The cover 130 in such a condition falls to the front side because the other end of coil spring 134 engages thereto. However, when the case 140 is positioned within the not fall to the front side and thus the inserting mouth 126 of the case is closed under this condition.

Usually the cover 130 is closing the inserting mouth 126 by means of the coil spring 134. However, when the unit 100 is inserted into the inserting mouth 126, the cover falls on to inner surface of the bottom plate of case 140. When the unit 100 is withdrawn, the cover 130 closes again the inserting mouth 126 by means of the spring force of the coil spring 134 against the cover 130.

Figure 24A:
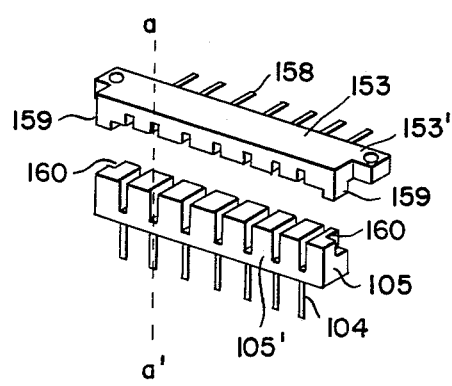
FIG. 24A is a perspective view of a pair of connectors incorporated into the present invention providing electrical terminals for connecting the bubble memory unit and holder unit.
Figure 24B:
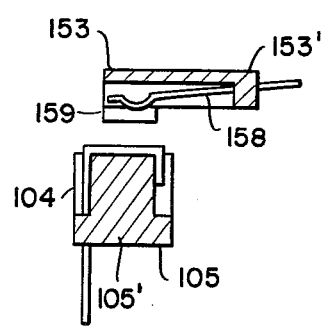
FIG. 24B is a side sectional view of the connectors incorporated into the present invention taken along the line a . . . a' of FIG. 24A.

FIGS. 24A and B show the connector 105 in the unit 100 and connector 153 in the unit 120. The electrical terminals 104 of the connector 105 are arranged in a U-shape and are mounted to a connector mold 105'. In the case of connector 153, the electrical terminals 158 have a spring property and are mounted on a connector mold 153'. The rotating operation of unit 100 causes the connector 105 to move upward thereby establishing electrical connection between both electrical terminals 104 and 158. In this embodiment, a dent 160 is formed on one of the connector molds 105' and 153', while a projection 159 is formed on the other mold, and positioning is performed by engagement of the dent 160 and projection 159 and electrical connection is set up by means of the pressure contact between both electrical terminals 104 and 158.

Also in the second embodiment, electrical connection between both units is established by inserting the unit and rotating it, the same operation as that disclosed for the first embodiment and illustrated in FIGS. 15 and 16.

In addition to the advantages similar to that of the first embodiment, the above second embodiment of an electrical connecting device incorporating the present invention can prevent accumulation of dust on the contact surfaces of the electrical terminals and damage on the contact surfaces by careless mistakes and can assure highly reliable electrical connection by providing the cover for closing and opening the electrical terminals to the unit to be inserted. In addition, the opening and closing cover is also provided to the unit inserting mouth of the receiving unit and thereby further reliable electrical connection is realized.

In addition, the connectors of both units having the electrical terminals are mutually positioned at the time of connection and therefore no positional deflection is generated and still further reliable electrical connection can be realized.

Moreover, the opening and closing covers of both units automatically open and close during the insertion and withdrawal operations of the unit to be inserted and thereby overall operation is very simplified.

We claim:

1. An electrical connecting device comprising a first connecting unit consisting of a cassette type bubble memory having a case and a magnetic bubble memory element accommodated within the case and a second connecting unit having an accommodating port for insertingly receiving said first connecting unit, both units having electrical terminals connected electrically by inserting said first connecting unit into said second connecting unit through the accommodating port of said second unit, wherein said second connecting unit has a freely rotatable unit accommodating case for receiving and guiding said first connecting unit so that said first connecting unit does not come into contact with said electrical terminals of said second connecting unit when said first connecting unit is inserted into said second connecting unit, said unit accommodating case being rotatable together with said first connecting unit when said first connecting unit inserted through said accommodating port is rotated in a direction almost at a right angle to the inserting direction, wherein said first connecting unit is locked in a connecting condition when said electrical terminals of said first connecting unit are connected to said electrical terminals of said second connecting unit through rotation of said first connecting unit, and wherein said second connecting unit further comprises means for locking said unit accommodating case so that the connecting condition with said first connecting unit can be maintained and means for releasing said locked connecting condition, wherein said unit accommodating case and said first connecting unit simultaneously rotate and return to the inserting condition when said releasing means releases the locked connecting condition, said first connecting unit being removeable from said unit accommodating case at said returning insertion condition.

2. The electrical connecting device according to claim 1, wherein said locking means comprises a lock lever for engaging said unit accommodating case through rotation, and said lock releasing means comprises a push button for releasing the engagement between said unit accommodating case and said lock lever by operating said lock lever, and a coil spring for returning said unit accommodating case to the inserting condition when said push button is operated.

3. An electrical connecting device comprising a first connecting unit consisting of a cassette type bubble memory having a case and a magnetic bubble memory element accommodated within the case and a second connecting unit having an accommodating port for insertingly receiving said first connecting unit, both units having electrical terminals connected electrically by inserting said first connecting unit into said second connecting unit through the accommodating port of said second unit, wherein said second connecting unit has a freely rotatable unit accommodating case for receiving and guiding said first connecting unit so that said first connecting unit does not come into contact with said electrical terminals of said second connecting unit when said first connecting unit is inserted into said second connecting unit, said unit accommodating case being rotatable together with said first connecting unit when said first connecting unit inserted through said accommodating port is rotated in a direction almost at a right angle to the inserting direction, wherein said first connecting unit is locked in a connecting condition when said electrical terminals of said first connecting unit are connected to said electrical terminals of said second connecting unit through rotation of said first connecting unit, and wherein an L-shaped groove is formed in at least one side of said first connecting unit, and a pin-type projection is formed on said second connecting unit projecting to said accommodating port, and wherein said first connecting unit is inserted into said accommodating port through engagement between said groove and projection, and wherein, when said first connecting unit is rotated, said projection engages with the upper-L portion of said groove for preventing said first connecting unit from being withdrawn from said second connecting unit.

4. An electrical connecting device comprising a first connecting unit consisting of a cassette type bubble memory having a case and a magnetic bubble memory element accommodated within the case and a second connecting unit having an accommodating port for insertingly receiving said first connecting unit, both units having electrical terminals connected electrically by inserting said first connecting unit into said second connecting unit through the accommodating port of said second unit, wherein said second connecting unit has a freely rotatable unit accommodating case for receiving and guiding said first connecting unit so that said first connecting unit does not come into contact with said electrical terminals of said second connecting unit when said first connecting unit is inserted into said second connecting unit, said unit accommodating case being rotatable together with said first connecting unit when said first connecting unit inserted through said accommodating port is rotated in a direction almost at a right angle to the inserting direction, wherein said first connecting unit is locked in a connecting condition when said electrical terminals of said first connecting unit are connected to said electrical terminals of said second connecting unit through rotation of said first connecting unit, and wherein said second connecting unit has a front side provided with a through window and wherein said second connecting unit has a predetermined portion visible through said window only when the electrical terminals of said both connecting units come into pressure contact.

5. An electrical connecting device comprising a first connecting unit consisting of a cassette type bubble memory having a case and a magnetic bubble memory element accommodated within the case and a second connecting unit having an accommodating port for insertingly receiving said first connecting unit, both units having electrical terminals connected electrically by inserting said first connecting unit into said second connecting unit through the accommodating port of said second unit, wherein said second connecting unit has a freely rotatable unit accommodating case for receiving and guiding said first connecting unit so that said first connecting unit does not come into contact with said electrical terminals of said second connecting unit when said first connecting unit is inserted into said second connecting unit, said unit accommodating case being rotatable together with said first connecting unit when said first connecting unit inserted through said accommodating port is rotated in a direction almost at a right angle to the inserting direction, wherein said first connecting unit is locked in a connecting condition when said electrical terminals of said first connecting unit are connected to said electrical terminals of said second connecting unit through rotation of said first connecting unit, and wherein said first connecting unit has a cover which covers said electrical terminals and can be freely opened or closed, and wherein said unit accommodating case has a projection which projects toward the inside at the rear portion thereof, said projection releasing the cover covering said electrical terminals of said first connecting unit when said first connecting unit is inserted into said unit accommodating case, thereby allowing said electrical terminals of said first connecting unit to be connected with said electrical terminals of said second connecting unit.

6. An electrical connecting device comprising a first connecting unit consisting of a cassette type bubble memory having a case and a magnetic bubble memory element accommodated within the case and a second connecting unit having an accommodating port for insertingly receiving said first connecting unit, both units having electrical terminals connected electrically by inserting said first connecting unit into said second connecting unit through the accommodating port of said second unit, wherein said second connecting unit has a freely rotatable unit accommodating case for receiving and guiding said first connecting unit so that said first connecting unit does not come into contact with said electrical terminals of said second connecting unit when said first connecting unit is inserted into said second connecting unit, said unit accommodating case being rotatable together with said first connecting unit when said first connecting unit inserted through said accommodating port is rotated in a direction almost at a right angle to the inserting direction, wherein said first connecting unit is locked in a connecting condition when said electrical terminals of said first connecting unit are connected to said electrical terminals of said second connecting unit through rotation of said first connecting unit, and wherein said second connecting unit has a cover which covers said inserting opening and can be opened or closed freely.

7. An electrical connecting device comprising a first connecting unit consisting of a cassette bubble memory having a case and a magnetic bubble memory element accommodated within the case and a second connecting unit having an accommodating opening for insertingly receiving said first connecting unit, both units having electrical terminals connected electrically by inserting said first connecting unit into said second connecting unit through the accommodating port of said second unit, wherein said first connecting unit has said electrical terminals located at the inserting side edge of the case and a cover provided at the inserting side edge of said case for covering said electrical terminals, said cover being freely opened or closed by sliding along the inserting direction of said first connecting unit in such a manner that said cover is opened after sliding when said first connecting unit is inserted into said second connecting unit for exposing said electrical terminals and said cover is closed after sliding when said first connecting unit is removed from said second connecting unit for covering said electrical terminals, and wherein said electrical terminals of said first connecting unit are in pressure contact with said electrical terminals of said second connecting unit when said first connecting unit is inserted into the accommodating port of said second connecting unit and said first connecting unit is rotated in a direction almost at the right angle to the inserting direction.

8. The electrical connecting device according to claim 7 further comprising a coil spring for activating said cover in the insertion direction of said first connecting unit.

9. An electrical connecting device according to claim 7, wherein said second connecting unit has a pin-type projection formed thereon projecting into the accommodating port and wherein said first connecting unit has formed in at least one side an L-shaped groove, said groove engaging with the pin-type projection of said second connecting unit for guiding said first connecting unit into said accommodating port and for preventing said first connecting unit from being withdrawn from said second connecting unit.

10. The electrical connecting device according to claim 7 further comprising a unit accommodating case rotatably provided at the inside of said second connecting unit for receiving and guiding said first connecting unit therein so that said first connecting unit does not come into contact with said electrical terminal of said second connecting unit at the time of insertion of said first connecting unit.

* * * * *